United States Patent [19]
Walters, Jr.

[11] Patent Number: 4,804,871
[45] Date of Patent: Feb. 14, 1989

[54] BIT-LINE ISOLATED, CMOS SENSE AMPLIFIER

[75] Inventor: Donald M. Walters, Jr., Austin, Tex.

[73] Assignee: Advanced Micro Devices, Inc., Sunnyvale, Calif.

[21] Appl. No.: 78,746

[22] Filed: Jul. 28, 1987

[51] Int. Cl.⁴ .................................... H03K 17/16
[52] U.S. Cl. .................................... 807/530; 307/443; 307/579; 365/203
[58] Field of Search ............... 307/350, 530, 579, 585, 307/443; 365/189–190, 196, 202, 203, 205, 208

[56] References Cited

U.S. PATENT DOCUMENTS

| | | | |
|---|---|---|---|
| 4,441,171 | 4/1984 | Hoffman | 307/530 X |
| 4,551,641 | 11/1985 | Pelley, III | 307/530 |
| 4,601,017 | 7/1986 | Mochizuki et al. | 365/189 |
| 4,634,901 | 1/1987 | McElroy | 307/530 |
| 4,645,954 | 2/1987 | Schuster | 307/530 X |
| 4,694,205 | 9/1987 | Shu et al. | 307/530 |
| 4,716,320 | 12/1987 | McAdams | 365/205 X |

*Primary Examiner*—David Hudspeth
*Attorney, Agent, or Firm*—Davis Chin

[57] ABSTRACT

A sense amplifier includes a pair of decoupling transistors (P4, P5) for isolating the sense nodes (X, Y) from the bit lines (B, B̄) during the assertion of a sense signal, thereby eliminating the occurrence of current spikes and increasing its gain.

8 Claims, 1 Drawing Sheet

BIT-LINE ISOLATED, CMOS SENSE AMPLIFIER

BACKGROUND OF THE INVENTION

This invention relates generally to semiconductor integrated circuits and more particularly, it relates to an improved sense amplifier circuit for use in high density random access memory devices to produce high speed, low noise operations.

As it generally known, sense amplifiers are used to detect small voltage differentials on pairs of bit lines which have a number of memory cells connected therebetween. In a cross-coupled pair sense amplifier, the amplifier feeds back to the bit lines. This is typically necessary to restore data in the selected storage or memory cell. The sense amplifier is generally expected to be able to detect differentials of approximately 200–400 millivolts on the bit lines. The amplifier senses the voltage differential on the bit lines and begins to further increase the voltage differential. In the usual practice, the bit lines are precharged and equalized in a precharge cycle by precharge transistors prior to activation of an access signal during a read or access cycle. Thus, it is necessary to delay assertion of a sense signal with respect to the access signal until after the bit lines have separated approximately 200–400 millivolts.

However, the delay in the assertion of the sense signal will create a corresponding delay in the deassertion of the sense signal, thereby causing it to overlap into the assertion of the next precharge cycle. As a result, a current spike in the range of 1–10 mA will be generated to a power supply terminal VSS since both the precharge transistors and the sense amp transistors will all be turned on. In a memory having a number of paired bit lines (columns), this could cause a current spike on the order of 1–2 amps so as to produce a ringing effect on the power supply terminal VSS.

It would therefore be desirable to provide an improved sense amplifier in which the sense nodes are isolated from the bit lines during the assertion of a sense signal in order to eliminate the occurrence of current spikes, but yet retain the gain in the cross-coupled sense amplifier. The sense nodes are capable of being quickly discharged without requiring large sense amp transistors since the bit line loading has been isolated.

SUMMARY OF THE INVENTION

Accordingly, it is a general object of the present invention to provide an improved sense amplifier circuit for use in a memory which has bit line pairs.

It is an object of the present invention to provide an improved sense amplifier circuit for use in high density random access memories to produce high speed, low noise operations.

It is another object of the present invention to provide an improved sense amplifier in which the sense nodes are isolated from the bit lines during the assertion of a sense signal, thereby eliminating the occurrence of current spikes.

In accordance with these aims and objectives, the present invention is concerned with the provision of a sense amplifier coupled to a pair of bit lines for sensing and amplifying a voltage differential between the pair of bit lines which includes a first N-channel transistor, a second N-channel transistor, a first P-channel transistor, a second P-channel transistor, and a third N-channel transistor. The first N-channel transistor has a drain electrode connected to a first sense node, a gate electrode connected to a second sense node, and a source electrode. The second N-channel transistor has a drain electrode connected to the second sense node, a gate electrode connected to the first sense node, and a source electrode connected to the source electrode of the first N-channel transistor. The first P-channel transistor has a source electrode connected to a supply potential, a gate electrode connected to the second sense node, and a drain electrode connected to the first sense node. The second P-channel transistor has a source electrode connected to the supply potential, a gate electrode connected to the first sense node, and a drain connected to the second sense node. The third N-channel transistor has a drain electrode connected to the source electrodes of the first and second N-channel transistors, a gate electrode connected to receive a sense signal, and a source electrode connected to a ground potential.

The sense amplifier further includes decoupling means formed of a third P-channel transistor and a fourth P-channel transistor for isolating the sense nodes from the bit lines during the assertion of the sense signal so as to eliminate the occurrence of current spikes. The third P-channel transistor has a source electrode connected to a first bit line of the pair of bit lines, a gate electrode connected to receive the sense signal, and a source electrode connected to the first sense node. The fourth P-channel transistor has a source electrode connected to a second bit line of the pair of bit lines, a gate electrode connected to receive the sense signal, and a source electrode connected to the second sense node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
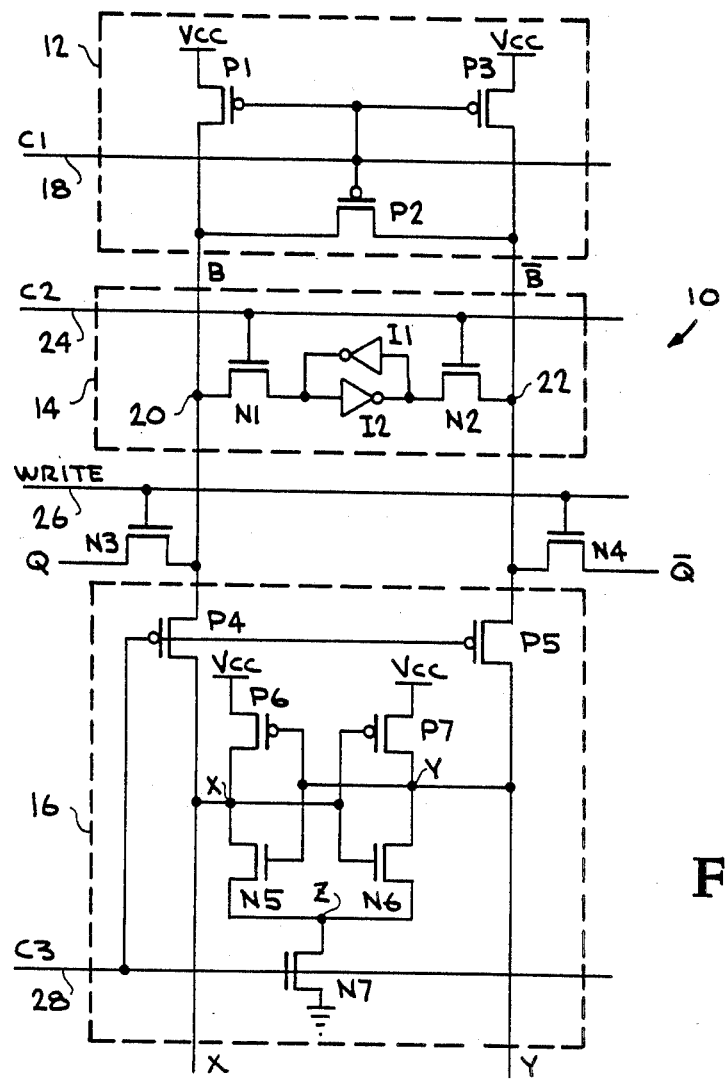
FIG. 1 is a schematic circuit diagram of a portion of a random access memory which includes a sense amplifier constructed in accordance with the principles of the present invention.

Referring now to the drawings, there is shown in FIG. 1 a portion of a random access memory (RAM) 10 comprised generally of an equilibration circuit 12, a bit storage cell 14, and a sense amplifier 16. The equilibration circuit 12 consists of P-channel transistors P1, P2 and P3. The transistor P1 has its source connected to a power supply voltage or potential VCC which is typically +5.0 volts, and its drain connected to a bit line B. The transistor P3 has its source connected to the supply potential VCC and its drain connected to a bit line B̄. The transistor P2 has its source and drain terminals connected between the paired bit lines B and B̄. The gate terminals of the transistors P1-P3 are connected together and to a line 18 for receiving a precharge signal C1.

The bit storage cell 14 is formed of cross-coupled inverters I1, I2 and N-channel access transistors N1, N2. The inverter I1 has its output connected to the input of the inverter I2 and to a first current electrode of the transistor N1. The inverter I2 has its output connected to the input of the inverter I1 and to a first current electrode of the transistor N2. The second current electrode of the transistor N1 is connected to the bit line B at node 20, and the second current electrode of the transistor N2 is connected to the bit line $\overline{B}$ at node 22. The first and second current electrodes of the transistors N1 and N2 will vary as to functioning as a source or drain. The control electrodes of the transistors N1 and N2 are connected together and to a line 24 for receiving an access signal C2.

It should be understood that a single RAM device may contain any number of additional paired bit lines or columns coupled to other corresponding sense amplifiers. For example, there may be 32 or 64 columns so as to form a 32-bit or 64-bit word. Further, each column may contain any number of additional bit storage cells connected between the bit lines B and $\overline{B}$. There may be perhaps 128 or 256 or more of these cells between each paired bit lines so as to form 128 or 256 different words. Only one of the bit cells in each column is activated at a time by a corresponding access signal which is selected by a row decoder (not shown). The access signal for a particular row would be sent to each corresponding bit cell in that particular row. In the case of an array having 128 rows and 32 columns, each one of the 128 32-bit words would be activated by a corresponding access signal.

An N-channel coupling transistor N3 has a first current electrode connected to the node 20, a control electrode connected to receive a write signal on line 26, and a second current electrode. An N-channel coupling transistor N4 has a first current electrode connected to the node 22, a control electrode connected to receive the write signal on the line 26, and a second current electrode. The second current electrodes of the transistors N3 and N4 are connected to receive respective true data signal Q and complementary data signal $\overline{Q}$. The data signals Q and $\overline{Q}$ are written into the memory cell 14 when the write signal and the access signal C2 are both asserted.

The sense amplifier 16 includes a cross-coupled differential amplifier formed of N-channel transistors N5, N6; a pair of P-channel load or pull-up transistors P6, P7; and N-channel enabling transistor N7; a P-channel decoupling transistor P4; and a P-channel decoupling transistor P5. The sense amplifier has a first sense node X connected to the bit line B via the source and drain terminals of the decoupling transistor P4 and a second sense node Y connected to the bit line $\overline{B}$ via the source and drain terminals of the decoupling transistor P5. The transistor N5 has its drain connected to the first sense node X, its gate connected to the second sense node Y, and its source connected to a node Z. The transistor N6 has its drain connected to the second sense node Y, its gate connected to the first sense node X, and its source connected to the node Z. The enabling transistor N7 has its drain connected to the sources of the transistors N5 and N6 at the node Z, its source connected to a power supply terminal VSS or ground potential, and its gate connected to a line 28 for receiving a sense signal C3.

The coupling means are formed by the transistors P4 and P5. The transistor P4 has its source connected to the bit line B at the node 20 and its drain connected to the first sense node X. The transistor P5 has its source connected to the bit line / at the node 22 and its drain connected to the second sense node Y. The gates of the transistors P4 and P5 are connected together and to the line 28 for receiving the sense signal C3. The load transistor P6 has its source connected to the supply potential VCC, its gate connected to the second sense node Y, and its drain connected to the first sense node X. The transistor P7 has its source also connected to the supply potential VCC, its gate connected to the first sense node X, and its drain connected to the second sense node Y.

The operation of the sense amplifier 16 will now be explained with reference to the waveforms shown in FIGS. 2(a)–2(c). At a time $t_0$ in the waveform of FIG. 2(a), the precharge signal C1 is at a low logic level causing the turning on of the transistors P1, P2 and P3. As a result, the voltage on the bit lines B and $\overline{B}$ are equalized to the approximate level of the supply potential VCC during this portion of the precharge cycle. At a time $t_1$ after the bit lines B and $\overline{B}$ have been equalized, the precharge portion terminates with the signal C1 switching to a high logic level which turns off the transistors P1, P2 and P3. Between the times $t_0$ and $t_1$ of the precharge cycle, the sense signal C3 is at a low logic level. Thus, the transistors P4 and P5 are also turned on which couples the voltage at the respective nodes 20 and 22 to the corresponding sense nodes X and Y. However, the sense amplifier is still disabled since the enabling transistor N7 is turned off. As the precharge portion goes to a high logic level, the bit cell 14 between the bit lines B and $\overline{B}$ is enabled by the access signal C2.

Assume that the output of the inverter I1 is at a logic "1" level and the output of the inverter I2 is at a logic "0" level (the bit cell storing a logic "1" level). Under this condition, the access transistor N1 will not be turned on since the voltage applied to its gate (the signal C2) will not be one threshold voltage above the voltage at the output of the inverter I1 (the logic "1" level). Thus, the voltage on the node 20 will not be discharged. The access transistor N2 will, however, be turned on since the voltage applied to the gate (the signal C2) will be more than one threshold above the voltage at the output of the inverter I2 (the logic "0" level). As a result, the voltage at the node 22 will begin to discharge through the transistor N2 and the inverter I2, causing a voltage separation between the bit lines B and $\overline{B}$. Since the decoupling transistors P4 and P5 are also turned on at this time, the first and second sense nodes X and Y will also have this same voltage separation. This voltage separation is allowed to increase to approximately 200–400 millivolts due to the enabling of the bit cell 14 until the time $t_2$.

Figure 2:
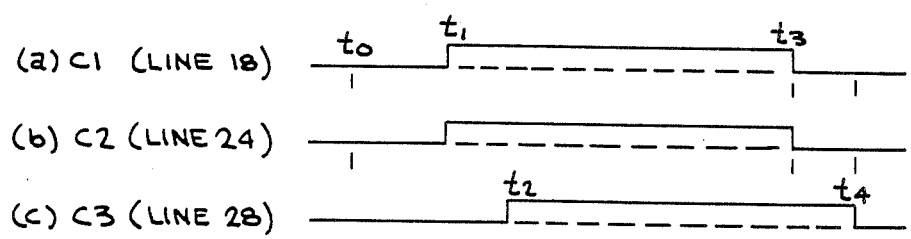
FIGS. 2(a)–2(c) are waveforms useful in understanding the operation of the sense amplifier of FIG. 1.

As can be seen by comparing FIGS. 2(b) and 2(c), the assertion of the sense signal C3 is delayed with respect to the access signal C2 from the times $t_1$ to $t_2$ in order to permit the accomplishment of such voltage difference. At the time $t_2$, the sense signal C3 is asserted for the purpose of turning off the transistors P4 and P5 so as to isolate the first and second sense nodes X and Y from the respective bit lines B and $\overline{B}$, thereby eliminating a current spike. The assertion of the sense signal C3 also turns on the enabling transistor N7 so as to activate the sense amplifier for the purpose of amplifying the voltage differential on the sense nodes X and Y and causing them to separate further. This is achieved by the sense signal C3 switching to a high logic level at the time $t_2$.

The enabling transistor N7 is of relatively low gain so that the node Z does not quickly reach the ground potential. Since the nodes X and Y are at a relatively high potential, the load transistors P6 and P7 are rendered nonconductive. However, at this time both of the transistors N5 and N6 are conducting. Since the gate voltage of the transistor N6 will be higher than the gate voltage of the transistor N5, the transistor N6 will be rendered more conductive. This will cause the node Y connected to the gate of the transistor N5 to be pulled lower and thus begin to turn off the transistor N5 and turn on the transistor P6. As a result, the node X connected to the drain of the transistor N5 will be pulled high. This will, in turn, cause the transistor N6 to be turned on more and the transistor P7 will remain in its nonconductive state. This process continues until the node Y reaches the logic "0" level.

It will be noted, at the time $t_3$ the next cycle of the precharge signal C1 is started before the sense signal C3 has been deasserted. This again causes the voltage on the bit lines B and $\bar{B}$ at the respective nodes 20 and 22 to be equalized. However, this voltage on the nodes 20 and 22 or the bit lines has been decoupled from the sense nodes X and Y via the decoupling transistors P4 and P5 during this overlap time between the times $t_3$ and $t_4$.

If the decoupling transistors P4 and P5 were omitted, all of the transistors P1, P2 and P3 of the equilibration circuit 12 as well as the sense amplifier transistors N5, N6 and N7 would be turned on during such overlap time. As a result, there would be a discharge path between the supply potential VCC and the ground potential VSS, creating a current spike. By the provision of these transistors P4 and P5, the problem of the current spikes have been eliminated. Further, since the sense nodes X and Y are isolated from the bit line loading, these nodes X and Y can be discharged quickly without requiring an increased size of the transistors N5, N6, N7, P6 or P7.

If it is assumed that the output of the inverter I1 is at a logic "0" level and the output of the inverter I2 is at a logic "1" level (the bit cell storing a logic "0" level), the operation of the sense amplifier would still be quite similar to that previously described except that the sense nodes X and Y are reversed. In other words, the node X would be the one to discharge to the final low logic level. Of course, the transistors N5, N6, P6 and P7 would operate in an opposite manner.

From the foregoing detailed description, it can thus be seen that the present invention provides an improved sense amplifier circuit for use in high density random access memory devices to produce high speed, low noise operations. The sense amplifier includes decoupling means formed of a pair of P-channel transistors for isolating the sense nodes from the bit lines during the assertion of a sense signal in order to eliminate the occurrence of current spikes.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A sense amplifier coupled to a pair of bit lines for sensing and amplifying a voltage differential between the pair of bit lines, comprising:
   a first N-channel transistor (N5) having a drain electrode connected to a first sense node (X), a gate electrode connected to a second sense node (Y), and a source electrode;
   a second N-channel transistor (N6) having a drain electrode connected to the second sense node (Y), a gate electrode connected to the first sense node (X), and a source electrode connected to the source electrode of the first N-channel transistor (N5);
   a first P-channel transistor (P6) having a source electrode connected to a supply potential (VCC), a gate electrode connected to the second sense node (Y), and a drain electrode connected to the first sense node (X);
   a second P-channel transistor (P7) having a source electrode connected to the supply potential (VCC), a gate electrode connected to the first sense node (X), and a drain electrode connected to the second sense node (Y);
   a third N-channel transistor (N7) having a drain electrode connected to the source electrodes of the first and second N-channel transistors (N5, N6) a gate electrode connected to receive a sense signal, and a source electrode connected to a ground potential (VSS);
   a third P-channel transistor (P4) having a source electrode connected to a first bit line (B) of the pair of bit lines, a gate electrode connected to receive the sense signal, and a source electrode connected to the first sense node (X);
   a fourth P-channel transistor (P5) having a source electrode connected to a second bit line ($\bar{B}$) of the pair of bit lines, a gate electrode connected to receive the sense signal, and a source electrode connected to the second sense node; and
   said third and fourth P-channel transistors (P4, P5) being turned off so as to isolate the pair of bit lines (B, B) from the sense nodes (X, Y) when the sense signal is at a high logic level, thereby eliminating a current spike to the ground potential (VSS).

2. A sense amplifier as claimed in claim 1, further comprising an equilibration circuit (12) connected between the pair of bit lines (B, $\bar{B}$).

3. A sense amplifier as claimed in claim 2, wherein said equilibration circuit (12) comprises fifth, sixth and seventh P-channel transistors (P1, P3, P2).

4. A sense amplifier as claimed in claim 3, wherein said fifth transistor (P1) has a source connected to the supply potential (VCC), a gate electrode connected to receive a precharge signal, and a drain electrode; said sixth transistor (P3) has a source electrode connected to the supply potential (VCC), a gate electrode connected to receive the precharge signal, and a drain electrode; and said seventh transistor (P2) has a first current electrode connected to the drain electrode of said fifth transistor (P1), a gate electrode connected to receive the precharge signal, and a second current electrode connected to the drain electrode of said sixth transistor (P3).

5. A sense amplifier as claimed in claim 4, wherein said fifth, sixth and seventh transistors (P1, P3, P2) are turned on when the precharge signal is at a low logic level so as to equalize the voltage on the pair of bit lines (B, $\bar{B}$).

6. A sense amplifier coupled to a pair of bit lines for sensing and amplifying a voltage differential between the pair of bit lines, comprising:
- a first N-channel transistor (N5) having a drain electrode connected to a first sense node (X), a gate electrode connected to a second sense node (Y), and a source electrode;
- a second N-channel transistor (N6) having a drain electrode connected to the second sense node (Y), a gate electrode connected to the first sense node (X), and a source electrode connected to the source electrode of the first N-channel transistor (N5);
- a first P-channel transistor (P6) having a source electrode connected to a supply potential (VCC), a gate electrode connected to the second sense node (Y), and a drain electrode connected to the first sense node (X);
- a second P-channel transistor (P7) having a source electrode connected to the supply potential (VCC), a gate electrode connected to the first sense node (X), and a drain electrode connected to the second sense node (Y);
- a third N-channel transistor (N7) having a drain electrode connected to the source electrodes of the first and second N-channel transistors (N5, N6) a gate electrode connected to receive a sense signal, and a source electrode connected to a ground potential (VSS);
- first decoupling means responsive to said sense signal and being interconnected between said first bit line (B) and said first sense node (X) for eliminating a current spike when said sense signal is at a high logic level; and
- second decoupling means responsive to said sense signal and being interconnected between said second bit line (B) and said second sense node (Y) for eliminating a current spike when said sense signal is at a high logic level.

7. A sense amplifier as claimed in claim 6, wherein said first decoupling means comprises a third P-channel transistor (P4).

8. A sense amplifier as claimed in claim 7, wherein said second decoupling means comprises a fourth P-channel transistor (P5).

* * * * *